(12) United States Patent
Ma

(10) Patent No.: US 9,767,916 B2
(45) Date of Patent: Sep. 19, 2017

(54) SHIFT REGISTER AND DISPLAY APPARATUS

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 179 days.

(21) Appl. No.: 14/235,592

(22) PCT Filed: Mar. 29, 2013

(86) PCT No.: PCT/CN2013/073515
§ 371 (c)(1),
(2) Date: Jan. 28, 2014

(87) PCT Pub. No.: WO2014/131217
PCT Pub. Date: Sep. 4, 2014

(65) Prior Publication Data
US 2015/0155052 A1 Jun. 4, 2015

(30) Foreign Application Priority Data
Feb. 27, 2013 (CN) .......................... 2013 1 0061887

(51) Int. Cl.
*G11C 19/18* (2006.01)
*G09G 3/36* (2006.01)
*G11C 19/28* (2006.01)

(52) U.S. Cl.
CPC ............ *G11C 19/184* (2013.01); *G09G 3/36* (2013.01); *G09G 3/3688* (2013.01); *G11C 19/28* (2013.01);
(Continued)

(58) Field of Classification Search
CPC ............ G09G 3/36; G09G 2310/0286; G09G 3/3688; G09G 2310/0289; G11C 19/184; G11C 19/28
See application file for complete search history.

(56) References Cited

U.S. PATENT DOCUMENTS 7,982,704 B2 * 7/2011 Shin .............................. 345/100
8,019,039 B1 * 9/2011 Tsai ..................... G11C 19/184
377/64

(Continued)

FOREIGN PATENT DOCUMENTS

CN 203118416 U 8/2013

OTHER PUBLICATIONS

First Office Action issued by the Chinese Patent Office for Chinese Patent Application No. 201310061887.0 dated Jul. 8, 2014, 5pgs.
(Continued)

*Primary Examiner* — Kumar Patel
*Assistant Examiner* — Sejoon Ahn
(74) *Attorney, Agent, or Firm* — Ladas & Parry LLP

(57) ABSTRACT

The present disclosure relates to a shift register and a display apparatus, wherein the shift register comprising an input module, a pull-down module, an inversion module and a first pull-up module; wherein, the input module supplies an input signal voltage to a pull-down node in response to a first clock signal, wherein the pull-down node is an output node of the input module; the pull-down module stores the input signal voltage and supplies a second clock signal to an output terminal in response to the pull-down node; the inversion module supplies a positive power supply voltage or a negative power supply voltage to a first pull-up node in response to the pull-down node; and the first pull-up module supplies the positive power supply voltage to the output terminal in response to the first pull-up node. Some or all the
(Continued)

floating nodes in the shift register are not floated any more by improvement; as an alternative, the sources/drains of the TFTs subjected to the effects of the floating nodes are controlled so that the output stability of the shift register is improved.

12 Claims, 3 Drawing Sheets

(52) U.S. Cl.
CPC ............. *G09G 2310/0286* (2013.01); *G09G 2310/0289* (2013.01)

(56) References Cited

U.S. PATENT DOCUMENTS

| | | | | |
|---|---|---|---|---|
| 8,299,982 B2* | 10/2012 | Chung | | 345/76 |
| 9,311,892 B2* | 4/2016 | Zhang | | G02F 1/167 |
| 9,436,014 B2* | 9/2016 | Kroon | | G02B 27/2214 |
| 2002/0033676 A1* | 3/2002 | Harada | | G09G 3/30 |
| | | | | 315/169.1 |
| 2002/0149318 A1* | 10/2002 | Jeon et al. | | 315/169.1 |
| 2003/0043104 A1* | 3/2003 | Lee | | G02F 1/1345 |
| | | | | 345/92 |
| 2003/0231735 A1* | 12/2003 | Moon | | G09G 3/3685 |
| | | | | 377/64 |
| 2004/0165692 A1* | 8/2004 | Moon | | G09G 3/20 |
| | | | | 377/64 |
| 2005/0068279 A1* | 3/2005 | Hirota | | G06F 1/3203 |
| | | | | 345/87 |
| 2005/0184946 A1* | 8/2005 | Pyoun | | G09G 3/3677 |
| | | | | 345/94 |
| 2005/0264505 A1* | 12/2005 | Kim | | 345/87 |
| 2005/0264514 A1* | 12/2005 | Kim | | G11C 19/28 |
| | | | | 345/100 |
| 2006/0001637 A1* | 1/2006 | Pak et al. | | 345/100 |
| 2006/0145999 A1* | 7/2006 | Cho | | G11C 19/00 |
| | | | | 345/100 |
| 2007/0086558 A1* | 4/2007 | Wei | | G11C 19/28 |
| | | | | 377/64 |
| 2007/0147573 A1* | 6/2007 | Tobita | | G09G 3/3648 |
| | | | | 377/64 |
| 2007/0164974 A1* | 7/2007 | Chang | | G09G 3/3648 |
| | | | | 345/100 |
| 2007/0262976 A1* | 11/2007 | Matsuda | | G09G 3/3611 |
| | | | | 345/208 |
| 2008/0001800 A1* | 1/2008 | Chang | | G09G 3/3688 |
| | | | | 341/144 |
| 2008/0013670 A1* | 1/2008 | Lo | | G11C 19/28 |
| | | | | 377/79 |
| 2008/0165172 A1* | 7/2008 | Lee | | 345/211 |
| 2008/0219401 A1* | 9/2008 | Tobita | | 377/79 |
| 2009/0058790 A1* | 3/2009 | Chiang et al. | | 345/100 |
| 2009/0122213 A1* | 5/2009 | Ko | | G09G 3/3677 |
| | | | | 349/46 |
| 2009/0303211 A1* | 12/2009 | Hu | | 345/204 |
| 2010/0002827 A1* | 1/2010 | Shih et al. | | 377/57 |
| 2010/0201668 A1* | 8/2010 | Ko et al. | | 345/211 |
| 2010/0207667 A1* | 8/2010 | Kwon et al. | | 327/108 |
| 2011/0001534 A1* | 1/2011 | Chuang | | G09G 3/3696 |
| | | | | 327/200 |
| 2011/0273417 A1* | 11/2011 | Shin et al. | | 345/211 |
| 2012/0262497 A1* | 10/2012 | Chang | | G09G 3/3674 |
| | | | | 345/690 |
| 2014/0064436 A1* | 3/2014 | Ma | | 377/64 |
| 2014/0306872 A1* | 10/2014 | Yun | | G09G 3/3618 |
| | | | | 345/99 |
| 2015/0155052 A1* | 6/2015 | Ma | | G09G 3/36 |
| | | | | 345/100 |

OTHER PUBLICATIONS

English translation of First Office Action issued by the Chinese Patent Office for Chinese Patent Application No. 201310061887.0 dated Jul. 8, 2014, 3pgs.

International Preliminary Report on Patentability Appln. No. PCT/CN2013/073515; Dated Sep. 1, 2015

* cited by examiner

SHIFT REGISTER AND DISPLAY APPARATUS

CROSS REFERENCE TO RELATED APPLICATIONS

This application is based on International Application No. PCT/CN2013/073515 filed on Mar. 29, 2013, which claims priority to Chinese National Application No. 201310061887.0 filed on Feb. 27, 2013, the contents of which are incorporated herein by reference.

TECHNICAL FIELD

The disclosure relates to the art of the technique for driving a liquid crystal display, and particularly to a shift register and a display apparatus.

BACKGROUND

A tablet display is promoted in recent years due to its characteristics such as ultra-thin thickness and energy-saving. Shift registers are used in most tablet displays, wherein the shift registers are implemented by a method for integrating a gate driving apparatus on a liquid crystal panel (gate on array, GOA), thus omitting a gate driving Integrated Circuit (IC) and reducing a manufacturing process, so that not only the cost for manufacturing the tablet display is decreased, but also the period for manufacturing the tablet display is shorten to some extent. Therefore, the technique of GOA is widely used in manufacturing of the tablet display in recent years. However, there is a problem existed that the output stability of GOA is to be addressed in the design of GOA.

FIG. 1 shows a basic unit of GOA in prior art, wherein the basic unit of GOA comprises six Thin Film Transistors (TFTs) M12, M19, M20, M21, M22, M23 and a capacitor C1, and CLK, CLKB represent clock signals, VGH represents a positive power supply voltage, VGL represents a negative power supply voltage, STV represents an input signal, and a node B represents a pull-down node; in an actual application, a node A and a node C in the GOA interfere with each other due to a residual voltage signal of a previous period, affecting the turning-on of TFT M19, and the shift register can not operate stably for a long time, so that the output signal of the output terminal OUTPUT is unstable.

SUMMARY

In one aspect, embodiments of the present invention provide a shift register and a display apparatus, wherein the floating nodes in the shift register can be improved in the operation, and the problem that the output of the shift register is unstable can be addressed.

The aspect of the embodiments of the present invention is realized by the following technical solutions:

An embodiment of the present invention provides a shift register comprising an input module, a pull-down module, an inversion module and a first pull-up module; wherein, The input module supplies an input signal voltage to a pull-down node in response to a first clock signal, wherein the pull-down node is an output node of the input module;

The pull-down module stores the input signal voltage and supplies a second clock signal to an output terminal in response to an output voltage at the pull-down node;

The inversion module supplies a positive power supply voltage or a negative power supply voltage to a first pull-up node in response to the output voltage at the pull-down node; and The first pull-up module supplies the positive power supply voltage to the output terminal in response to an output voltage at the first pull-up node.

Preferably, the input module comprises:

A first TFT having a gate connected to a first clock signal terminal, a source connected to an input signal terminal, and a drain as an output node of the input module, i.e., as the pull-down node.

Preferably, the pull-down module comprises:

A second TFT having a gate connected to the pull-down node, a source connected to a second clock signal terminal, and a drain connected to the output terminal; and a capacitor connected between the pull-down node and the drain of the second TFT.

Preferably, the inversion module comprises:

A third TFT having a gate connected to the pull-down node, a source connected to the positive power supply voltage terminal, and a drain connected to the first pull-up node; and A fourth TFT having a gate and drain connected to the negative power supply voltage terminal, and a source connected to the first pull-up node.

Preferably, the first pull-up module comprises:

A fifth TFT having a gate connected to the first pull-up node, a source connected to the positive power supply voltage terminal, and a drain connected to the output terminal.

Preferably, the shift register further comprises a second pull-up module, wherein the second pull-up module supplies the positive power supply voltage to the output terminal in response to the output voltage at the pull-down node and the input signal.

Preferably, the second pull-up module comprises:

A sixth TFT having a gate connected to the pull-down node, a source connected to the input signal terminal, and a drain connected to a second pull-up node; and A seventh TFT having a gate connected to the second pull-up node, a source connected to the positive power supply voltage terminal, and a drain connected to the output terminal.

An embodiment of the present invention provides a display apparatus comprising cascaded shift registers as described above.

The beneficial effect of the embodiments of the present invention is as follows: some or all the floating nodes in the shift register are not floated any more by improvement; as an alternative, the sources/drains of the TFTs subjected to the effects of the floating nodes are controlled so that the output stability of the shift register is improved.

REFERENCE SIGNS IN FIGS. 2-4

101: input module
102: pull-down module
103: inversion module
104: first pull-up module
105: second pull-up module
M29: first TFT
M28: second TFF
M24: third TFF
M26: fourth TFF
M27: fifth TFF
M25: sixth TFF
M30: seventh TFF

DETAILED DESCRIPTION OF THE PREFERRED EMBODIMENTS

A detailed description will be given to the implementation of embodiments of the present invention with reference to the accompanying figures.

Figure 1:
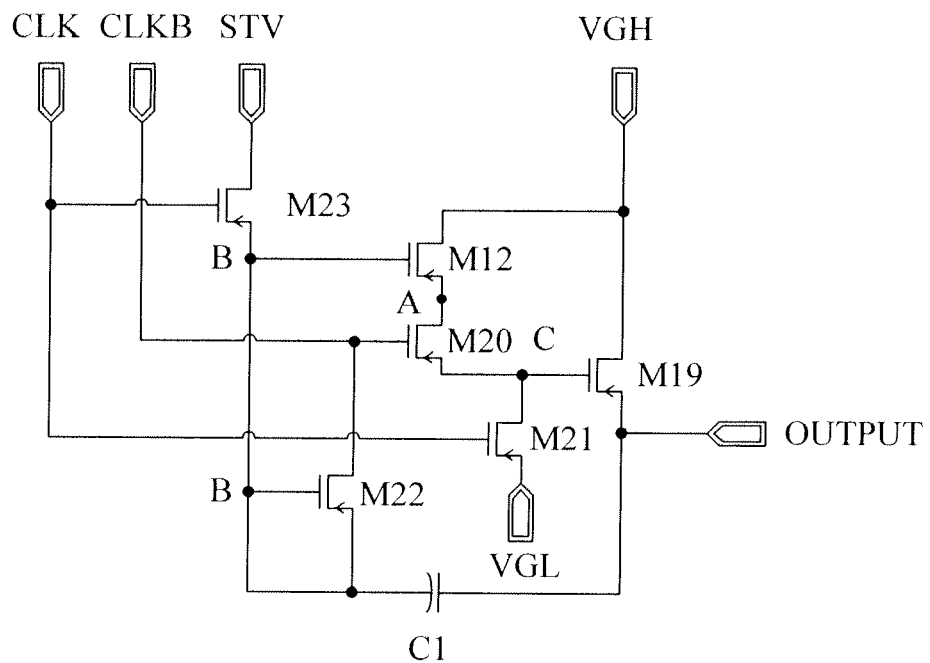
FIG. 1 is a schematic structure diagram of a basic unit of a shift register in the prior art.
Figure 2:
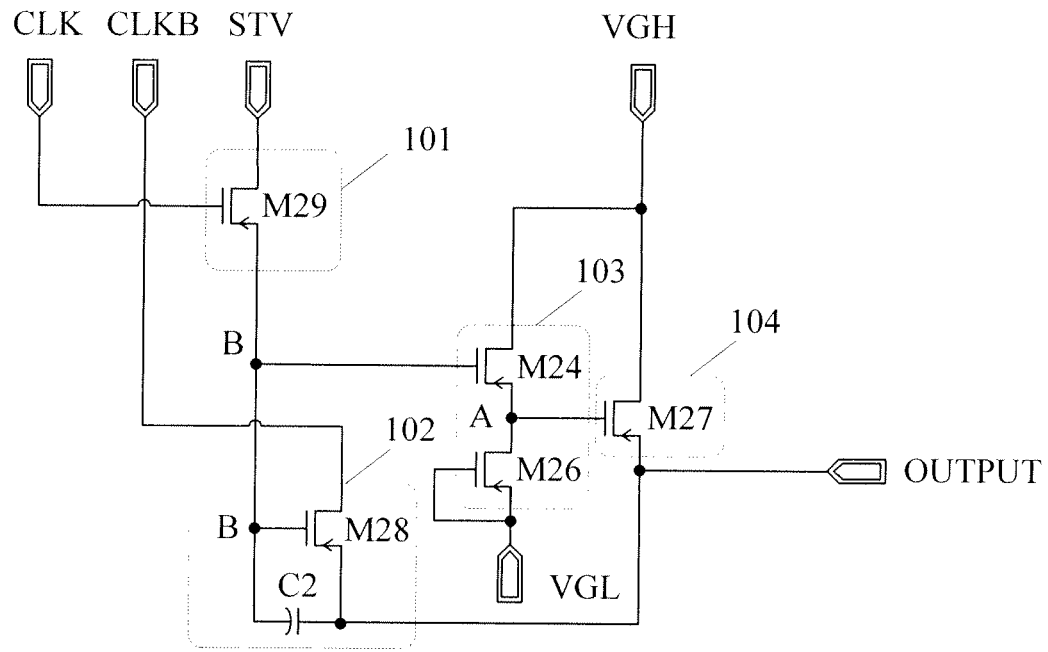
FIG. 2 is a schematic structure diagram of a shift register according to a first embodiment of the present invention.

A first embodiment of the present invention provides a shift register, as shown in FIG. 2, the shift register comprises an input module 101, a pull-down module 102, an inversion module 103 and a first pull-up module 104; wherein, The input module 101 supplies an input signal STV to a pull-down node B in response to a first clock signal CLK, wherein the pull-down node B is an output node of the input module 101;

The pull-down module 102 stores the input signal STV and in response to an output voltage at the pull-down node B, supplies a second clock signal CLKB to an output terminal OUTPUT;

The inversion module 103 supplies a positive power supply voltage VGH or a negative power supply voltage VGL to a first pull-up node A in response to the output voltage at the pull-down node B; and The first pull-up module 104 supplies the positive power supply voltage VGH to the output terminal OUTPUT in response to an output voltage at the first pull-up node A.

Preferably, the input module 101 comprises:

A first TFT M29 having a gate connected to a first clock signal CLK terminal, a source connected to an input signal STV terminal, and a drain as an output node of the input module 101, i.e., as the pull-down node B.

Preferably, the pull-down module 102 comprises:

A second TFT M28 having a gate connected to the pull-down node B, a source connected to a second clock signal CLKB terminal, and a drain connected to the output terminal OUTPUT; and a capacitor C2 connected between the pull-down node B and the drain of the second TFT M28.

Preferably, the inversion module 103 comprises:

A third TFT M24 having a gate connected to the pull-down node B, a source connected to the positive power supply voltage terminal VGH, and a drain connected to the first pull-up node A; and A fourth TFT M26 having a gate and drain connected to the negative power supply voltage terminal VGL, and a source connected to the first pull-up node A.

Preferably, the first pull-up module 104 comprises:

A fifth TFT M27 having a gate connected to the first pull-up node A, a source connected to the positive power supply voltage terminal VGH, and a drain connected to the output terminal OUTPUT.

Figure 3:
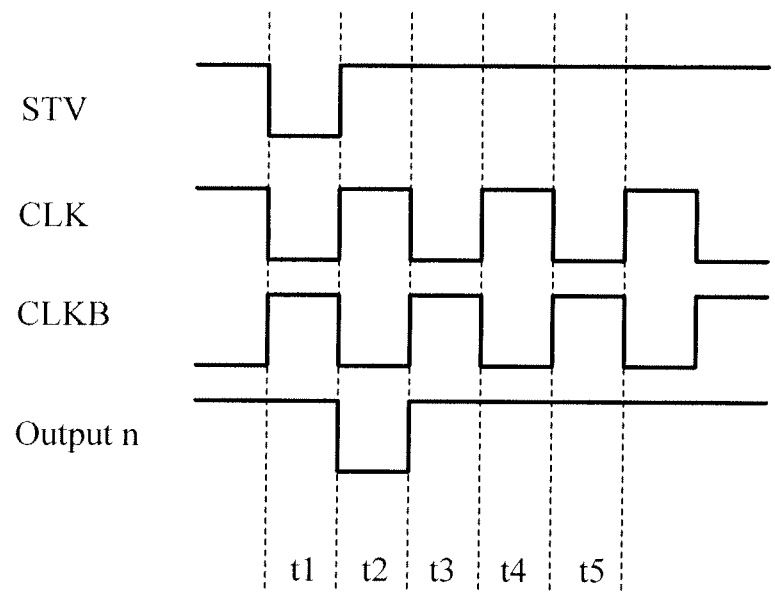
FIG. 3 is a timing diagram of control signals of the shift register according to the first embodiment of the present invention.

With reference to a control timing diagram shown in FIG. 3, a driving method for the shift register provided in the first embodiment of the present invention comprises:

A first phase t1, in which the first clock signal CLK is at a low level, the second clock signal CLKB is at a high level, and the input signal STV is at a low level. Since the first clock signal CLK is at a low level, the first TFT M29 is turned on, and the low level input signal STV is input to the pull-down node B, so that the second TFT M28 and the third TFT M24 are turned on due to the low level at the pull-down node B; the third TFT M24 having been turned on outputs a high level positive power supply voltage VGH to the first pull-up node A, and the fifth TFT M27 is turned off due to the high level at the first pull-up node A; the second TFT M28 having been turned on outputs a high level second clock signal CLKB to the output terminal OUTPUT of the shift register.

A second phase t2, in which the first clock signal CLK is at a high level, the second clock signal CLKB is at a low level, and the input signal STV is at a high level; the low level at the pull-down node B is held by the capacitor C2, and thus the second TFT M28 is turned on; the second TFT M28 having been turned on outputs a low level second clock signal CLKB to the output terminal OUTPUT, and meanwhile pulls down a potential at the pull-down node B.

At this time, the low level at the pull-down node B makes the third TFT M24 be in a turning-on state and outputs the positive power supply voltage VGH to the first pull-up node A, and makes the fifth TFT M27 be turned off, thus ensuring that the output terminal OUTPUT receives a stable signal from the second TFT M28.

A third phase t3, in which the first clock signal CLK is at a low level, the second clock signal CLKB is at a high level, and the input signal STV is at a high level; since the first clock signal CLK is at a low level, the first TFT M29 is turned on, and the first TFT M29 having been turned on outputs a high level input signal STV to the pull-down node B, and the second TFT M28 and the third TFT M24 are turned off due to the high level at the pull-down node B. The fourth TFT M26 receives a low level negative power supply voltage VGL and outputs the same to the first pull-up node A, so that the fifth TFT M27 is turned on, and the fifth TFT M27 having been turned on outputs the high level positive power supply voltage VGH to the output terminal OUTPUT.

A fourth phase t4, in which the first clock signal CLK is at a high level, the second clock signal CLKB is at a low level, and the input signal STV is at a high level; the pull-down node B is still maintained by the capacitor C2 at the high level of the third phase t3, so that the second TFT M28 and the third TFT M24 are in the turning-off state. The low level second clock signal CLKB can not be output to the output terminal OUTPUT via the second TFT M28, and thus the stability of the output signal can not be affected.

Meanwhile, the fourth TFT M26 receives a low level negative power supply voltage VGL and outputs the same to the first pull-up node A, so that the fifth TFT M27 is turned on, and the fifth TFT M27 having been turned on outputs the high level positive power supply voltage VGH to the output terminal OUTPUT.

A fifth phase t5, in which the first clock signal CLK is at a low level, the second clock signal CLKB is at a high level, and the input signal STV is at a high level; and the operation is the same as that in the third phase t3.

Subsequent phases will repeat the third and fourth phases, and the output terminal always outputs a high level signal until a low level input signal STV is received, and performs an output according to the current timing when the low level input signal STV is received.

The beneficial effect of the embodiment of the present invention is as follows: some or all the floating nodes in the shift register are not floated any more by improvement; as an alternative, the sources/drains of the TFTs subjected to the effects of the floating nodes are controlled so that the output stability of the shift register is improved.

Figure 4:
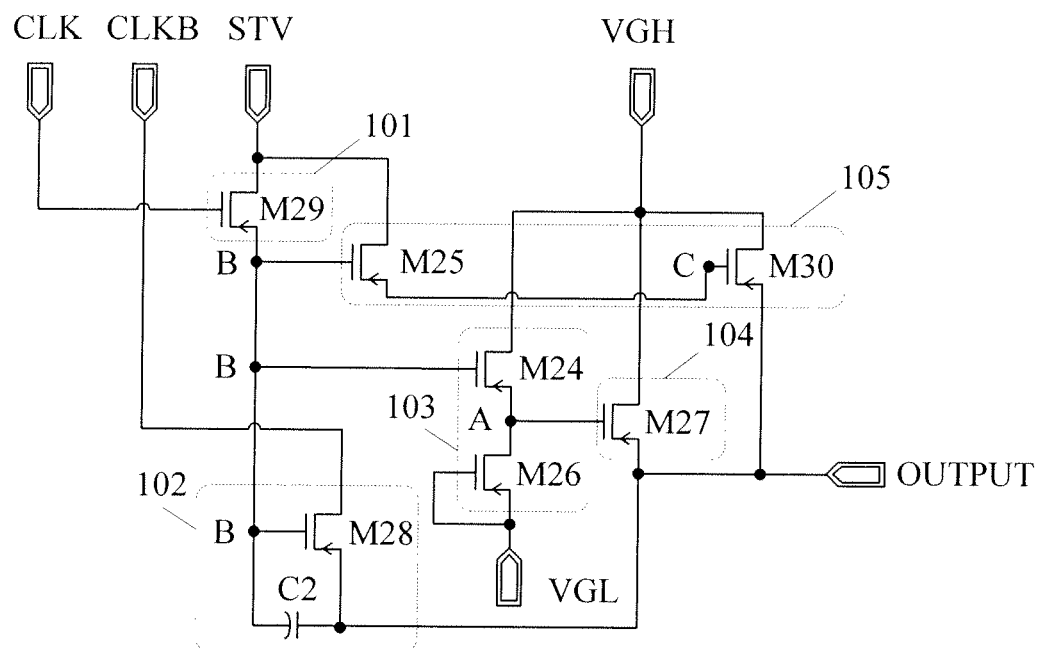
FIG. 4 is a schematic structure diagram of a shift register according to a second embodiment of the present invention.

A second embodiment of the present invention provides a shift register, as shown in FIG. 4, the shift register comprises an input module 101, a pull-down module 102, an inversion module 103, a first pull-up module 104 and a second pull-up module 105; wherein, The input module 101 supplies an input signal STV to a pull-down node B in response to a first clock signal CLK, wherein the pull-down node B is an output node of the input module 101;

The pull-down module 102 stores the input signal STV and in response to an output voltage at the pull-down node B, supplies a second clock signal CLKB to an output terminal OUTPUT;

The inversion module 103 supplies a positive power supply voltage VGH or a negative power supply voltage VGL to a first pull-up node A in response to the output voltage at the pull-down node B;

The first pull-up module 104 supplies the positive power supply voltage VGH to the output terminal OUTPUT in response to an output voltage at the first pull-up node A; and The second pull-up module 105 supplies the positive power supply voltage VGH to the output terminal OUTPUT in response to the output voltage at the pull-down node B and the input signal STV.

Preferably, the input module 101 comprises:

A first TFT M29 having a gate connected to a first clock signal CLK terminal, a source connected to an input signal STV terminal, and a drain as an output node of the input module 101, i.e., as the pull-down node B.

Preferably, the pull-down module 102 comprises:

A second TFT M28 having a gate connected to the pull-down node B, a source connected to a second clock signal CLKB terminal, and a drain connected to the output terminal OUTPUT; and a capacitor C2 connected between the pull-down node B and the drain of the second TFT M28.

Preferably, the inversion module 103 comprises:

A third TFT M24 having a gate connected to the pull-down node B, a source connected to the positive power supply voltage terminal VGH, and a drain connected to the first pull-up node A; and A fourth TFT M26 having a gate and drain connected to the negative power supply voltage terminal VGL, and a source connected to the first pull-up node A.

Optionally, the first pull-up module 104 comprises:

A fifth TFT M27 having a gate connected to the first pull-up node A, a source connected to the positive power supply voltage terminal VGH, and a drain connected to the output terminal OUTPUT.

Optionally, the second pull-up module 105 comprises:

A sixth TFT M25 having a gate connected to the pull-down node B, a source connected to the input signal STV terminal, and a drain connected to a second pull-up node C; and A seventh TFT M30 having a gate connected to the second pull-up node C, a source connected to the positive power supply voltage terminal VGH, and a drain connected to the output terminal OUTPUT.

With reference to a control timing diagram shown in FIG. 3, a driving method for the shift register provided in the second embodiment of the present invention comprises:

A first phase t1, in which the first clock signal CLK is at a low level, the second clock signal CLKB is at a high level, and the input signal STV is at a low level. Since the first clock signal CLK is at a low level, the first TFT M29 is turned on, and the low level input signal STV is input to the pull-down node B, so that the second TFT M28 and the third TFT M24 are turned on due to the low level at the pull-down node B; the third TFT M24 having been turned on outputs a high level positive power supply voltage VGH to the first pull-up node A, and the fifth TFT M27 is turned off due to the high level at the first pull-up node A; the second TFT M28 having been turned on outputs a high level second clock signal CLKB to the output terminal OUTPUT of the shift register.

At the same time, the sixth TFT M25 is turned on due to the low level at the pull-down node B, and the sixth TFT M25 having been turned on outputs the low level input signal STV to the second pull-up node C, the seventh TFT M30 is turned on due to the low level at the second pull-up node C, and the seventh TFT M30 having been turned on outputs the high level positive power supply voltage VGH to the output terminal OUTPUT, thus ensuring the stability of the signal of the output terminal.

A second phase t2, in which the first clock signal CLK is at a high level, the second clock signal CLKB is at a low level, and the input signal STV is at a high level; the low level at the pull-down node B is held by the capacitor C2, and thus the second TFT M28 is turned on; the second TFT M28 having been turned on outputs a low level second clock signal CLKB to the output terminal OUTPUT, and meanwhile pulls down a potential at the pull-down node B.

At this time, the low level at the pull-down node B makes the third TFT M24 be in a turning-on state and outputs the positive power supply voltage VGH to the first pull-up node A, and makes the fifth TFT M27 be turned off, thus ensuring that the output terminal OUTPUT receives a stable signal from the second TFT M28.

Meanwhile, the sixth TFT M25 is turned on due to the low level at the pull-down node B, and the sixth TFT M25 having been turned on outputs the high level input signal STV to the second pull-up node C, and the seventh TFT M30 is turned off due to the high level at the second pull-up node C, not affecting the normal operation of the shift register.

A third phase t3, in which the first clock signal CLK is at a low level, the second clock signal CLKB is at a high level, and the input signal STV is at a high level; since the first clock signal CLK is at a low level, the first TFT M29 is turned on, and the first TFT M29 having been turned on outputs a high level input signal STV to the pull-down node B, and the second TFT M28, the third TFT M24 and the sixth TFT M25 are turned off due to the high level at the pull-down node B. The fourth TFT M26 receives a low level negative power supply voltage VGL and outputs the same to the first pull-up node A, so that the fifth TFT M27 is turned on, and the fifth TFT M27 having been turned on outputs the high level positive power supply voltage VGH to the output terminal OUTPUT.

It should be noted that the second pull-up node C is in a floating state since the sixth TFT M25 is turned off, and signals at the source and drain of the seventh TFT M30 under the control of the second pull-up node C are both at a high level, and thus the operation of the shift register is not affected, and the output signal from the output terminal OUTPUT is not affected either.

A fourth phase t4, in which the first clock signal CLK is at a high level, the second clock signal CLKB is at a low level, and the input signal STV is at a high level; the pull-down node B is still maintained by the capacitor C2 at the high level of the third phase t3, so that the second TFT M28, the third TFT M24 and the sixth TFT M25 are turned off. The low level second clock signal CLKB can not be output to the output terminal OUTPUT via the second TFT M28, and thus the stability of the output signal can not be affected.

Meanwhile, the fourth TFT M26 receives a low level negative power supply voltage VGL and outputs the same to the first pull-up node A, so that the fifth TFT M27 is turned on, and the fifth TFT M27 having been turned on outputs the high level positive power supply voltage VGH to the output terminal OUTPUT.

The signals at the source and drain of the seventh TFT M30 are both at a high level, and thus the operation of the shift register is not affected, and the output signal from the output terminal OUTPUT is not affected either.

A fifth phase t5, in which the first clock signal CLK is at a low level, the second clock signal CLKB is at a high level, and the input signal STV is at a high level; and the operation is the same as that in the third phase t3.

Subsequent phases will repeat the third and fourth phases, and the output terminal always outputs a high level signal until a low level input signal STV is received again, and performs an output according to the current timing when the low level input signal STV is received.

The beneficial effect of the embodiment of the present invention is as follows: some or all the floating nodes in the shift register are not floated any more by improvement; as an alternative, the sources/drains of the TFTs subjected to the effects of the floating nodes are controlled so that the output stability of the shift register is improved.

It should be noted that in the above embodiments of the present invention, a case in which the shift register is applied to a unidirectional scan structure is taken as an example, wherein all the TFTs are P type TFTs, and thus all the TFTs are turned on when the gates thereof are at a low level, and are turned off when the gates thereof are at a high level. Nevertheless, the technical solution of the embodiments of the present invention can be applied to the shift register in which TFTs are all N type TFTs or some of them are N type TFTs and others are P type TFTs. When the TFTs are all N type TFTs, the corresponding structure can be realized as long as respective signals in the structure of the shift register shown in FIG. 2 or FIG. 4 are inverted on levels and the positions of the positive power supply voltage VGH and the negative power supply voltage VGL are exchanged; the design of the shift register in which N type TFTs and P type TFTs are combined is similar to that of the shift register as described above, and the detailed description is omitted.

Figure 5:
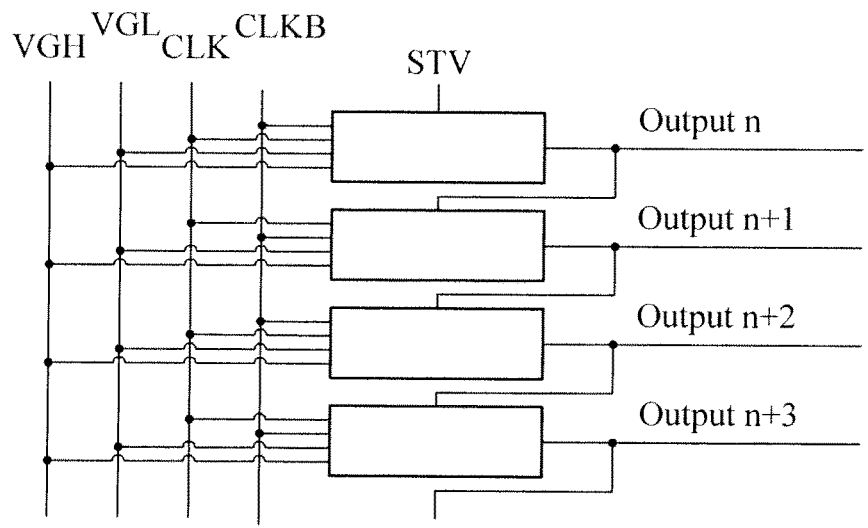
FIG. 5 is a schematic structure diagram of cascaded shift registers in a display apparatus according to a third embodiment of the present invention.

An embodiment of the present invention provides a display apparatus comprising a plurality of cascaded shift registers as described above, and FIG. 5 shows the cascaded shift registers comprising n cascaded shift registers according to the first embodiment or according to the second embodiment (only a part thereof is shown): a first clock signal CLK, a second clock signal CLKB, a positive power supply voltage VGH and a negative power supply voltage VGL are supplied to each shift register; meanwhile, an output terminal OUTPUT of a shift register at a previous stage is connected to an input signal terminal STV of a shift register at a current stage.

Figure 6:
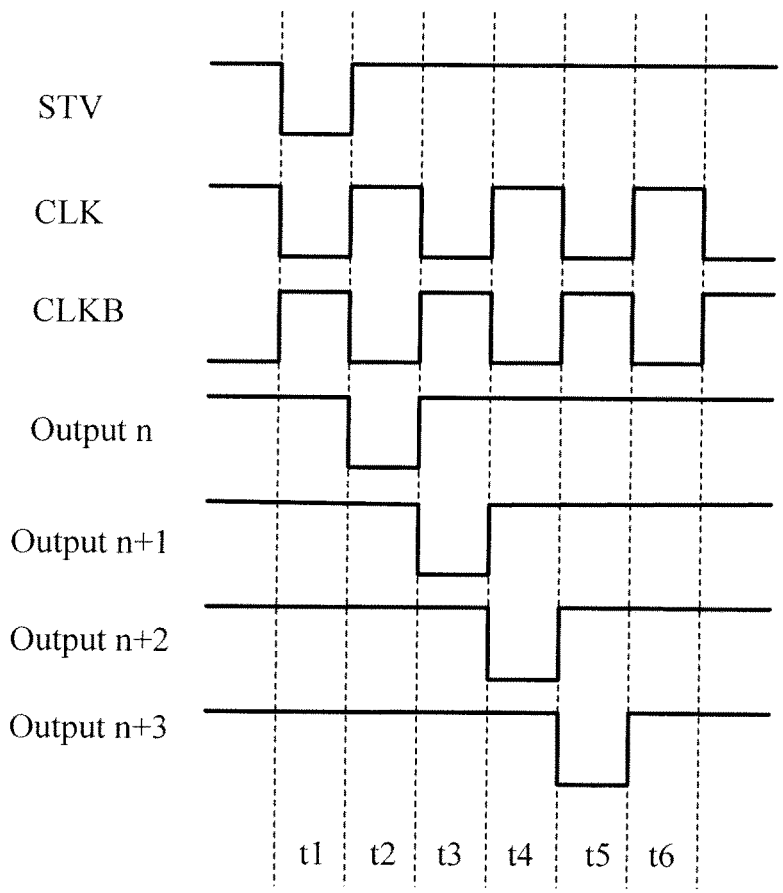
FIG. 6 is a timing diagram of control signals of the cascaded shift registers according to the third embodiment of the present invention.

The timing of the cascaded shift registers is shown in FIG. 6 (only the timing diagram of some cascaded shift registers is shown), wherein from a phase t1 to a phase t6, the low level of the output signal of a shift register at a next stage lags that of the output signal of a shift at a current stage sequentially.

The aforesaid only illustrates some embodiments of the present invention, and it should be noted that a number of modifications and variations can be made to the embodiments of the present invention by those skilled in the art without departing from the spirit and principle of the present invention, and such modifications and variation should be regarded as falling into the protection scope of the present invention.

What is claimed is:

1. A shift register comprising an input subcircuit, a pulldown subcircuit, an inversion subcircuit and a first pull-up subcircuit; wherein, the input subcircuit supplies an input signal voltage to a pull-down node in response to a first clock signal, wherein the pull-down node is an output node of the input subcircuit; the pull-down subcircuit stores the input signal voltage and supplies a second clock signal to an output terminal in response to an output voltage at the pull-down node; the inversion subcircuit supplies a positive power supply voltage to a first pull-up node in response to the output voltage at the pull-down node is low, and supplies a negative power supply voltage to the first pull-up node in response to the output voltage at the pull-down node is high; and the first pull-up subcircuit supplies the positive power supply voltage to the output terminal in response to an output voltage at the first pull-up node, wherein the input subcircuit comprises:

a first Thin Film Transistor (TFT) having a gate connected to a first clock signal terminal, a source connected to an input signal terminal, and a drain as the output node of the input subcircuit, the output node of the input subcircuit is the pull-down node, wherein the pull-down subcircuit comprises:

a second TFT having a gate connected to the pull-down node, a source connected to a second clock signal terminal, and a drain connected to the output terminal; and a capacitor connected between the pull-down node and the drain of the second TFT, and wherein the inversion subcircuit comprises:

a third TFT having a gate connected to the pull-down node, a source connected to the positive power supply voltage terminal, and a drain connected to the first pull-up node; and a fourth TFT having a gate and drain directly connected to the negative power supply voltage terminal, and a source connected to the first pull-up node.

2. The shift register of claim 1, wherein the first pull-up subcircuit comprises:

a fifth TFT having a gate connected to the first pull-up node, a source connected to the positive power supply voltage terminal, and a drain connected to the output terminal.

3. The shift register of claim 2, wherein the first, second, third, fourth, and fifth TFTs are P type TFTs.

4. The shift register of claim 1, further comprising a second pull-up subcircuit, wherein the second pull-up subcircuit supplies the positive power supply voltage to the output terminal in response to the output voltage at the pulldown node and the input signal.

5. The shift register of claim 4, wherein the second pull-up subcircuit comprises:
   a sixth TFT having a gate connected to the pull-down node, a source connected to the input signal terminal, and a drain connected to a second pull-up node; and
   a seventh TFT having a gate connected to the second pull-up node, a source connected to the positive power supply voltage terminal, and a drain connected to the output terminal.

6. The shift register of claim 5, wherein the sixth and seventh TFTs are P type TFTs.

7. A display apparatus comprising cascaded shift registers comprising an input subcircuit, a pull-down subcircuit, an inversion subcircuit and a first pull-up subcircuit; wherein, the input subcircuit supplies an input signal voltage to a pull-down node in response to a first clock signal, wherein the pull-down node is an output node of the input subcircuit;
   the pull-down subcircuit stores the input signal voltage and in response to an output voltage at the pull-down node, supplies a second clock signal to an output terminal;
   the inversion subcircuit supplies a positive power supply voltage to a first pull-up node in response to the output voltage at the pull-down node is low, and supplies a negative power supply voltage to the first pull-up node in response to the output voltage at the pull-down node is high; and
   the first pull-up subcircuit supplies the positive power supply voltage to the output terminal in response to an output voltage at the first pull-up node,
   wherein the input subcircuit comprises: a first Thin Film Transistor (TFT) having a gate connected to a first clock signal terminal, a source connected to an input signal terminal, and a drain as the output node of the input subcircuit, the output node of the input subcircuit is the pull-down node,
   wherein the pulldown subcircuit comprises: a second TFT having a gate connected to the pull-down node, a source connected to a second clock signal terminal, and a drain connected to the output terminal; and
   a capacitor connected between the pull-down node and the drain of the second TFT, and
   wherein the inversion subcircuit comprises:
   a third TFT having a gate connected to the pull-down node, a source connected to the positive power supply voltage terminal, and a drain connected to the first pull-up node; and
   a fourth TFT having a gate and drain directly connected to the negative power supply voltage terminal, and a source connected to the first pull-up node.

8. The display apparatus of claim 7, wherein the first pull-up subcircuit comprises:
   a fifth TFT having a gate connected to the first pull-up node, a source connected to the positive power supply voltage terminal, and a drain connected to the output terminal.

9. The display apparatus of claim 8, wherein the first, second, third, fourth, and fifth TFTs are P type TFTs.

10. The display apparatus of claim 7, further comprising a second pull-up subcircuit, wherein the second pull-up subcircuit supplies the positive power supply voltage to the output terminal in response to the output voltage at the pulldown node and the input signal.

11. The display apparatus of claim 10, wherein the second pull-up subcircuit comprises:
    a sixth TFT having a gate connected to the pull-down node, a source connected to the input signal terminal, and a drain connected to a second pull-up node; and a seventh TFT having a gate connected to the second pull-up node, a source connected to the positive power supply voltage terminal, and a drain connected to the output terminal.

12. The display apparatus of claim 11, wherein the sixth and seventh TFTs are P type TFTs.

* * * * *